United States Patent
Sung et al.

(10) Patent No.: US 6,738,296 B2
(45) Date of Patent: May 18, 2004

(54) SENSE AMPLIFIER ENABLE SIGNAL GENERATING CIRCUITS HAVING PROCESS TRACKING CAPABILITY AND SEMICONDUCTOR MEMORY DEVICES INCLUDING THE SAME

(75) Inventors: Nak-woo Sung, Seoul (KR); Hyun-su Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/392,423

(22) Filed: Mar. 19, 2003

(65) Prior Publication Data

US 2003/0206448 A1 Nov. 6, 2003

(30) Foreign Application Priority Data

May 3, 2002 (KR) .................................. 10-2002-0024484

(51) Int. Cl.[7] .................................................. G11C 7/00
(52) U.S. Cl. .................. 365/189.07; 365/205; 365/210; 365/233
(58) Field of Search ........................... 365/189.07, 205, 365/210, 233

(56) References Cited

U.S. PATENT DOCUMENTS 5,995,421 A * 11/1999 McKenny .................... 365/205
6,538,947 B2 * 3/2003 Ahmed et al. ......... 365/189.07

* cited by examiner

*Primary Examiner*—Huan Hoang
(74) *Attorney, Agent, or Firm*—Myers Bigel Sibley & Sajovec

(57) ABSTRACT

A sense amplifier enable signal generating circuit includes a dummy bit cell which is connected to a dummy word line and a dummy bit line and discharges the dummy bit line in response to a signal level of the dummy word line. The sense amplifier enable signal generating circuit further comprises a process tracking circuit which adjusts a signal level of the dummy word line in response to a signal level of the dummy bit line to adjust a discharge rate of the dummy bit line, and a sense amplifier control circuit that generates the sense amplifier enable signal responsive to the signal level of the dummy bit line. In further embodiments, the sense amplifier control circuit includes a control circuit that generates the sense amplifier enable signal responsive to an internal clock signal and a control signal. A process adjusting circuit is connected to the dummy bit line and generates the control signal responsive to a signal level on the dummy bit line and the internal clock signal.

29 Claims, 4 Drawing Sheets

SENSE AMPLIFIER ENABLE SIGNAL GENERATING CIRCUITS HAVING PROCESS TRACKING CAPABILITY AND SEMICONDUCTOR MEMORY DEVICES INCLUDING THE SAME

RELATED APPLICATION

This application claims priority from Korean Patent Application No. 2002-24484 filed on May 3, 2002 in the Korean Intellectual Property Office, the disclosure of which is incorporated herein in its entirety by reference.

BACKGROUND OF THE INVENTION

The present invention relates to semiconductor memory devices, and more particularly, to sense amplifier control circuits for memory devices.

Power supply voltages for semiconductor memory devices for use in portable systems have been increasingly lowered. However, it generally is not easy to increase the operating speed of semiconductor memory devices in such systems because of the reduced power supply voltage.

As the minimum design rule for manufacturing semiconductors has decreased, characteristics of transistors having minimum dimensions are generally more vulnerable to process variations. Delay times of internal circuits may vary with process variations and, thus, characteristics of the semiconductor devices, particularly operating speed, may deteriorate.

In a typical conventional semiconductor memory device, a bit line sense amplifier is driven by an enable signal that is generated from a sense amplifier enable signal generating circuit. The sense amplifier enable signal generating circuit typically receives an external clock signal applied from an external source and generates a sense amplifier enable signal. To perform a sensing operation after an address is applied from an external source, data stored in a memory cell (a bit cell) drives a pair of bit lines up to a predetermined level. The sense amplifier enable signal is activated. The sense amplifier enable signal generating circuit typically is configured so as to receive the external clock signal and then activate the sense amplifier enable signal after a delay of a predetermined period of time.

However, if the sense amplifier enable signal is prematurely activated (for example, when data is not fully developed on the bit lines) or delayed because of process variations, the sensing operation of the sense amplifier may be unstable or sensing speed may be reduced. Consequently, a pulse width of a word line signal for driving a pass transistor of a memory cell may have to be increased. However, this may increase power consumption. Thus, to prevent these problems from appearing in the semiconductor memory device, it is desirable that an instant when the sense amplifier enable signal is activated substantially coincides with the instant when data is fully developed to the bit lines up to a predetermined level over a range of process variations.

Conventional sense amplifier enable signal generating circuits often use an inverter delay chain or a replica technique. In a sense amplifier enable signal generating circuit that uses an inverter delay chain, a delay characteristic of the inverter delay chain and delay characteristics of a bit cell and a bit line may considerably vary with process variations. Thus, sense amplifier enable signal generating circuits that use a replica method are typically preferred.

FIG. 1 is a block diagram of a semiconductor memory device having a conventional sense amplifier enable signal generating circuit that uses a replica technique. Referring to FIG. 1, a sense amplifier enable signal generating circuit 100 using a replica technique includes a dummy discharge circuit 11, a dummy bit cell block 12, and a control circuit 13. A path for sensing data includes a part of a decoder 18, a word line WL, and a normal bit cell block 14. A path for generating a sense amplifier enable signal SAEN includes a part of the decoder 18, the dummy discharge circuit 11, a dummy bit cell block 12, and the control circuit 13.

The dummy bit cell block 12 is included in the same memory array block 200 as the bit cell block 14 and is designed so that the delay time thereof is substantially equal to the delay time of the normal bit cell block 14. The dummy bit cell block 12 includes the word line WL and a dummy bit cell 15 that is connected to a pair of dummy bit lines DBL and DBLB, and the normal bit cell block 14 includes the word line WL and a normal bit cell 16 that is connected to a pair of bit lines BL and BLB. The word line WL is connected to an output node of the decoder 18.

The pair of dummy bit lines DBL and DBLB are connected to the dummy discharge circuit 11, which discharges the dummy bit lines. The pair of dummy bit lines DBL and DBLB are connected to the control circuit 13, which generates an internal clock signal ICK from an external clock signal applied from an external source and which generates a sense amplifier enable signal SAEN in response to levels of the pair of dummy bit lines DBL and DBLB. The pair of bit lines BL and BLB are connected to a sense amplifier 17, which senses and amplifies a voltage between the pair of bit lines BL and BLB in response to the sense amplifier enable signal SAEN.

In more detail, after an address ADD is applied from an external source, the decoder 18 decodes the address ADD to activate the word line WL. As a result, data stored in the bit cell 16 is developed on the pair of bit lines BL and BLB. In response to a signal DO output from the decoder 18 and the internal clock signal ICK, the sense amplifier enable signal generating circuit 100 activates the sense amplifier enable signal SAEN after a predetermined delay time through the dummy discharge circuit 11, the dummy bit cell block 12, and the control circuit 13. The sense amplifier 17 senses and amplifies a voltage between the pair of bit lines BL and BLB in response to the activation of the sense amplifier enable signal SAEN after data stored in the bit cell 16 is developed on the pair of bit lines BL and BLB up to a predetermined level.

In order that an instant when the sense amplifier enable signal SAEN is activated substantially coincides with an instant when data is developed on the pair of bit lines BL and BLB up to a predetermined level, the replica-type sense amplifier enable signal generating circuit 100 uses the dummy bit cell block 12, which is designed so as to have substantially the same delay time as the delay time of the normal bit cell block 14. Delay factors of the dummy bit cell 15 and the pair of dummy bit lines DBL and DBLB in the dummy bit cell block 12 are substantially identical to delay factors of the bit cell 16 and the pair of bit lines DBL and DBLB in the normal bit cell block 14. Thus, the replica-type sense amplifier enable signal generating circuit 100 can be more stable in the presence of process variations than a sense amplifier enable signal generating circuit using an inverter delay chain.

However, as the minimum design rule in manufacturing semiconductors has decreased, characteristics of transistors having minimum dimensions may seriously vary according to process variation. Thus, a delay characteristic of the path for sensing data may be different from a delay characteristic of the path for generating the sense amplifier enable signal SAEN. In other words, due to the process variation, delay characteristics of the dummy bit cell block 12 and the dummy discharge circuit 11 may be different from a delay characteristic of the normal bit cell block 14. In this case, the sense amplifier enable signal SAEN may be prematurely activated, i.e., when data is not fully developed to the pair of bit lines BL and BLB, or a point of time that the sense amplifier enable signal SAEN is activated may be too delayed. As a result, the sensing operation of the sense amplifier 17 may not stably be performed or the sensing speed, i.e., the operating speed, may become slower.

If the delay characteristic of the path for sensing the data differs about 20% from the delay characteristic of the path for generating the sense amplifier enable signal SAEN, a pulse width of a signal of a word line WL for driving a pass transistor in the bit cell 16 typically may have to be increased to secure stability. However, this can lead to increased power consumption.

SUMMARY OF THE INVENTION

According to some embodiments of the present invention, a sense amplifier enable signal generating circuit for generating a sense amplifier enable signal that enables a bit line sense amplifier is provided. The sense amplifier enable signal generating circuit includes a dummy bit cell which is connected to a dummy word line and a dummy bit line and discharges the dummy bit line in response to a signal level of the dummy word line. The sense amplifier enable signal generating circuit further comprises a process tracking circuit which adjusts a signal level of the dummy word line in response to a signal level of the dummy bit line to adjust a discharge rate of the dummy bit line, and a sense amplifier control circuit that generates the sense amplifier enable signal responsive to the signal level of the dummy bit line.

In further embodiments, the sense amplifier control circuit includes a control circuit that generates the sense amplifier enable signal responsive to an internal clock signal and a control signal. A process adjusting circuit is connected to the dummy bit line and generates the control signal responsive to a signal level on the dummy bit line and the internal clock signal.

According to further embodiments of the present invention, a semiconductor memory device includes a bit cell which is connected to a word line and a pair of bit lines and which data is input to and output from through the pair of bit lines in response to a signal on the word line and a bit line sense amplifier which senses and amplifies data of the pair of bit lines in response to a sense amplifier enable signal. The memory device further includes a dummy bit cell which is connected to a dummy word line and a dummy bit line and discharges the dummy bit line in response to a signal on the dummy word line and a process tracking circuit which adjusts a signal level of the dummy word line in response to a signal level of the dummy bit line and a decoder output signal to adjust a discharge rate the dummy bit line. A control circuit generates the sense amplifier enable signal responsive to an internal clock signal and a control signal, and a process adjusting circuit is connected to the dummy bit line and generates the control signal responsive to a signal level on the dummy bit line and the internal clock signal. An address decoder decodes an address applied from an external source to activate the word line and the decoder output signal.

In further embodiments of the present invention, a sense amplifier enable signal generating circuit includes a delay circuit that is connected to a dummy word line and that produces a delayed output signal on a dummy bit line responsive to an input signal on the dummy word line. A process tracking circuit adjusts a level of the input signal in response an internal clock signal and a signal level of the output signal produced by the delay circuit to adjust a discharge rate of the output signal produced by the delay circuit. A sense amplifier control circuit produces a sense amplifier enable signal responsive to the signal level of the output signal produced by the delay circuit. The sense amplifier control circuit may further include a control circuit that generates the sense amplifier enable signal responsive to a control signal, and a process adjusting circuit that is connected to the dummy bit line and that generates the control signal responsive to a level of the output signal on the dummy bit line.

DETAILED DESCRIPTION OF THE INVENTION

Figure 1:
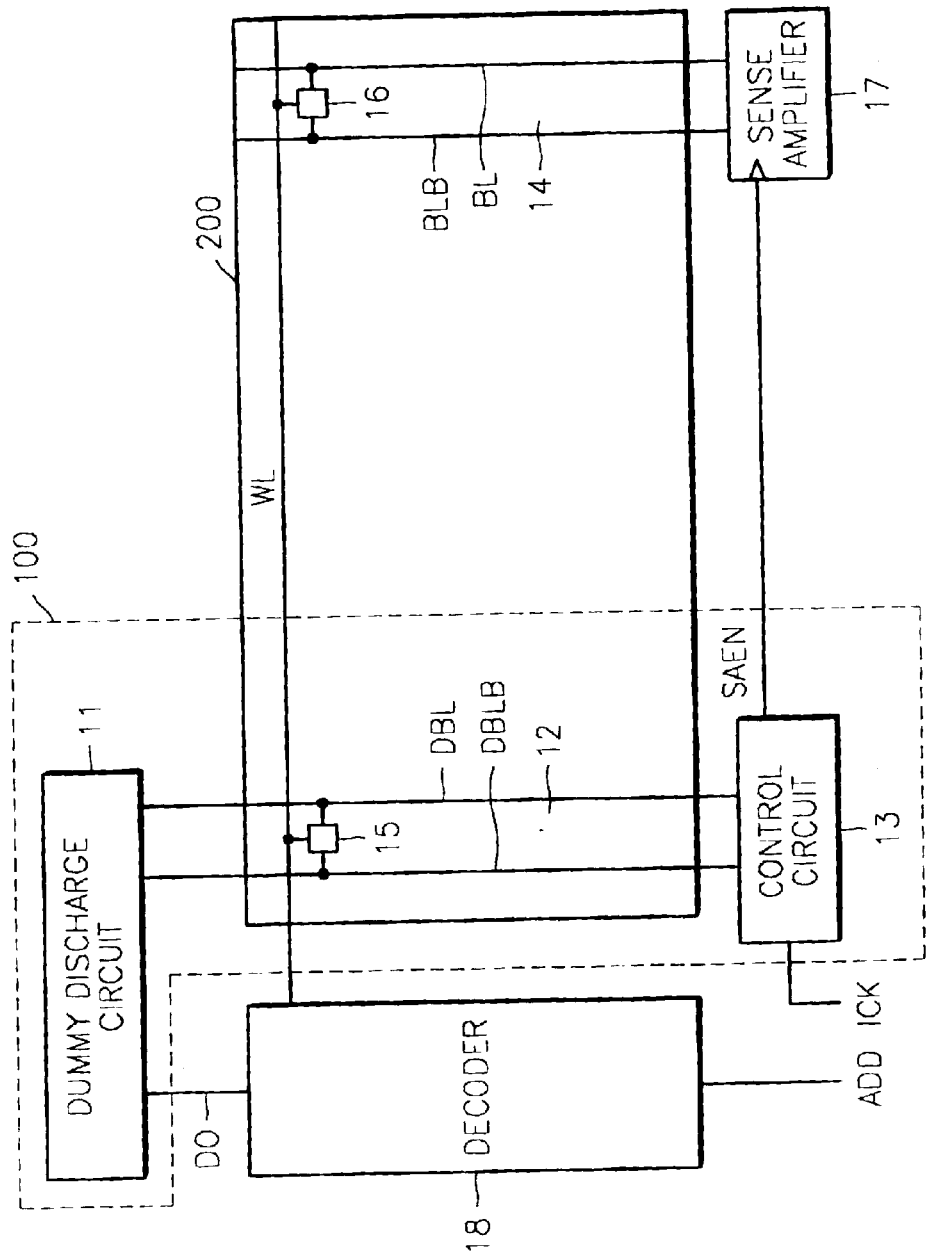
FIG. 1 is a block diagram of a semiconductor memory device having a conventional sense amplifier enable signal generating circuit that uses a replica technique.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Figure 2:
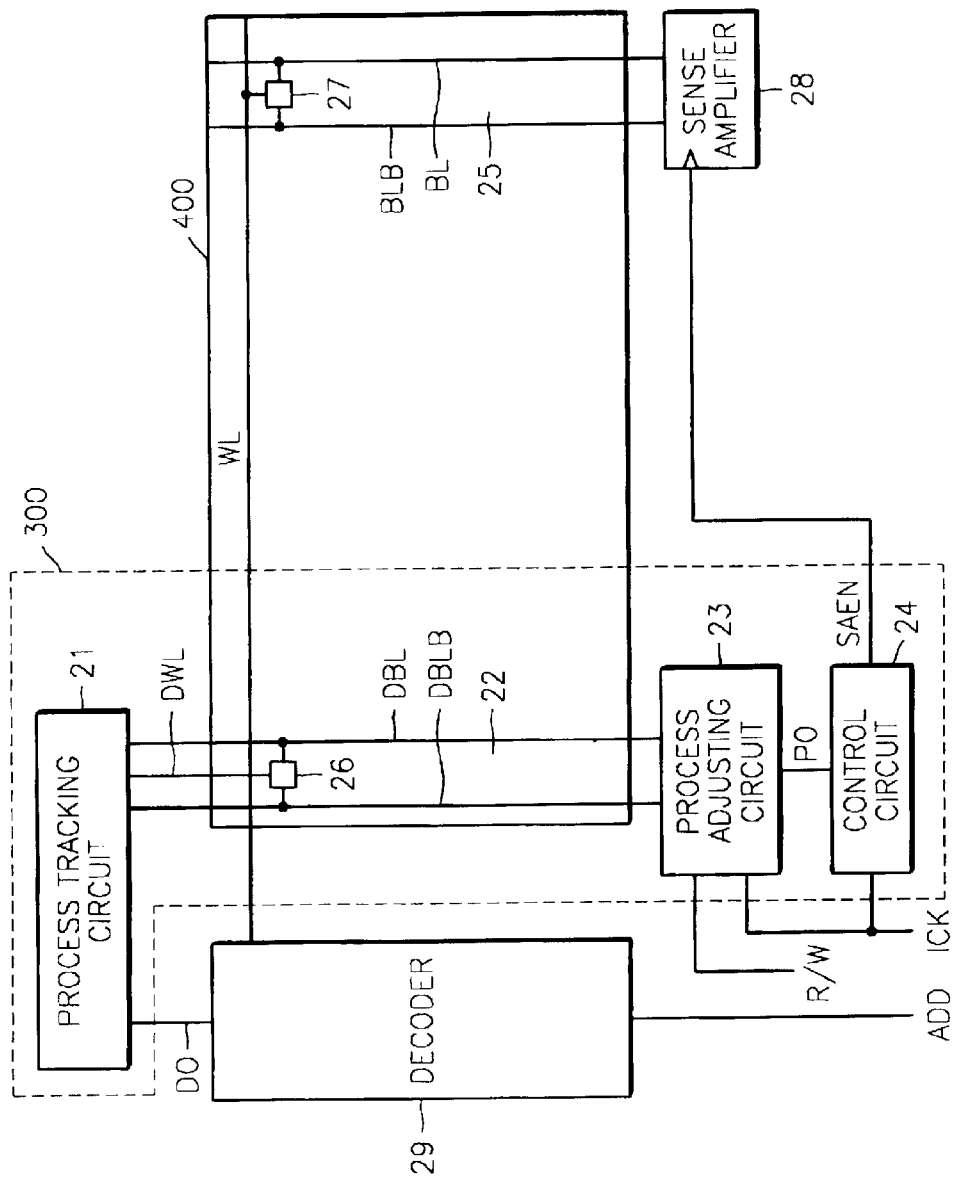
FIG. 2 is a block diagram of a semiconductor memory device having a replica-type sense amplifier enable signal generating circuit according to some embodiments of the present invention.

FIG. 2 is a block diagram of a semiconductor memory device having a replica-type sense amplifier enable signal generating circuit 300 according to some embodiments of the present invention. The replica-type sense amplifier enable signal generating circuit 300 includes a process tracking circuit 21, a dummy bit cell block 22, a process adjusting circuit 23, and a control circuit 24. A path for sensing data includes a decoder 29, a word line WL, and a normal bit cell block 25. A path for generating a sense amplifier enable signal SAEN includes the decoder 29, the process tracking circuit 21, the dummy bit cell block 22, the process adjusting circuit 23, and the control circuit 24.

In the path for sensing data, the normal bit cell block 25 takes the largest amount of time for sensing data. In other words, since a pair of bit lines BL and BLB that are connected to a normal bit cell 27 are generally long, parasitic capacitance of the pair of bit lines BL and BLB is relatively large. Thus, it generally takes much time to discharge the pair of bit lines BL and BLB. In order to reduce the difference between delay time in the path for sensing data and delay time in the path for generating the sense amplifier enable signal SAEN, the replica-type sense amplifier enable signal generating circuit 300 includes the dummy bit cell block 12, which is designed so that the delay time thereof is substantially the same as the delay time of the normal bit cell block 25.

Figure 3:
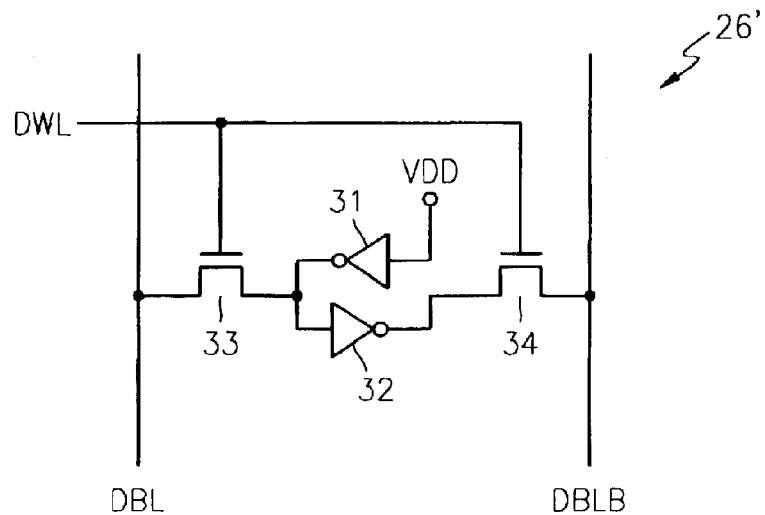
FIG. 3 is a detailed circuit diagram of a dummy bit cell according to further embodiments of the present invention.

The dummy bit cell block 22 is included with the normal bit cell block 25 in a memory cell array block 400. The normal bit cell block 25 includes the normal bit cell 27 that is connected to a word line WL and the pair of bit lines BL and BLB. The word line WL is connected to an output node of the decoder 29. The dummy bit cell block 22 is connected to a dummy word line DWL and a pair of dummy bit lines DBL and DBLB and includes a dummy bit cell 26, which may have a circuit configuration as shown in FIG. 3. The dummy word line DWL and a dummy bit line DBL are connected to the process tracking circuit 21 and the dummy bit line DBL is also connected to the process adjusting circuit 23.

A delay characteristic of the dummy bit cell block 22 may be different from a delay characteristic of the normal bit cell block 25 due to process variation. In particular, due to process variation, as a difference between characteristics of a PMOS transistor in the process adjusting circuit 23 operated by a signal of the dummy bit line DBL and a NMOS pass transistor in the normal bit cell 27 increases, a difference between delay times in the dummy bit cell block 22 and the normal bit cell block 25 may become significant. In other words, a difference between delay times in the path for generating the sense amplifier enable signal SAEN and the path for sensing data may become significant. The process tracking circuit 21 and the process adjusting circuit 23 adjust a discharge rate of the dummy bit line DBL when a difference in characteristics of the MOS transistors becomes significantly large.

The process tracking circuit 21 is controlled by a control signal DO, i.e., a signal output from the address decoder 29, and adjusts a signal level of the dummy word line DWL in response to a signal level of the dummy bit line DBL in order to adjust the discharge rate of the dummy bit line DBL when the difference in the characteristics of the MOS transistors is significantly great. The process adjusting circuit 23 generates an output signal PO in response to the signal level of the dummy bit line DBL and an internal clock signal ICK generated from an external clock signal.

The control circuit 24 generates the sense amplifier enable signal SAEN in response to the internal clock signal ICK and the output signal PO of the process adjusting circuit 23. The pair of bit lines BL and BLB are connected to a sense amplifier 28, which senses and amplifies a difference in voltages of the pair of bit lines BL and BLB in response to the sense amplifier enable signal SAEN. The decoder 29 decodes an address ADD applied from an external source to activate the word line WL and the control signal DO.

FIG. 3 is a detailed circuit diagram of a dummy bit cell 26' according to some embodiments of the present invention. The dummy bit cell 26' includes inverters 31 and 32 and NMOS pass transistors 33 and 34. The dummy bit cell 26' may be the same as the normal bit cell 27 of FIG. 2, except that an input node of the inverter 31 is connected to a power supply voltage VDD. A terminal of the NMOS pass transistor 33 is connected to the dummy bit line DBL and a terminal of the NMOS pass transistor 34 is connected to the dummy bit line DBLB that is complementary to the dummy bit line DBL.

Gates of the NMOS pass transistors 33 and 34 are connected to the dummy word line DWL, which is driven by the process tracking circuit 21. The dummy bit line DBL is discharged through the NMOS pass transistor 33 and an NMOS transistor of the inverter 31 in response to a signal of the dummy word line DWL, i.e., when the signal of the dummy word line DWL is logic "high".

Figure 4:
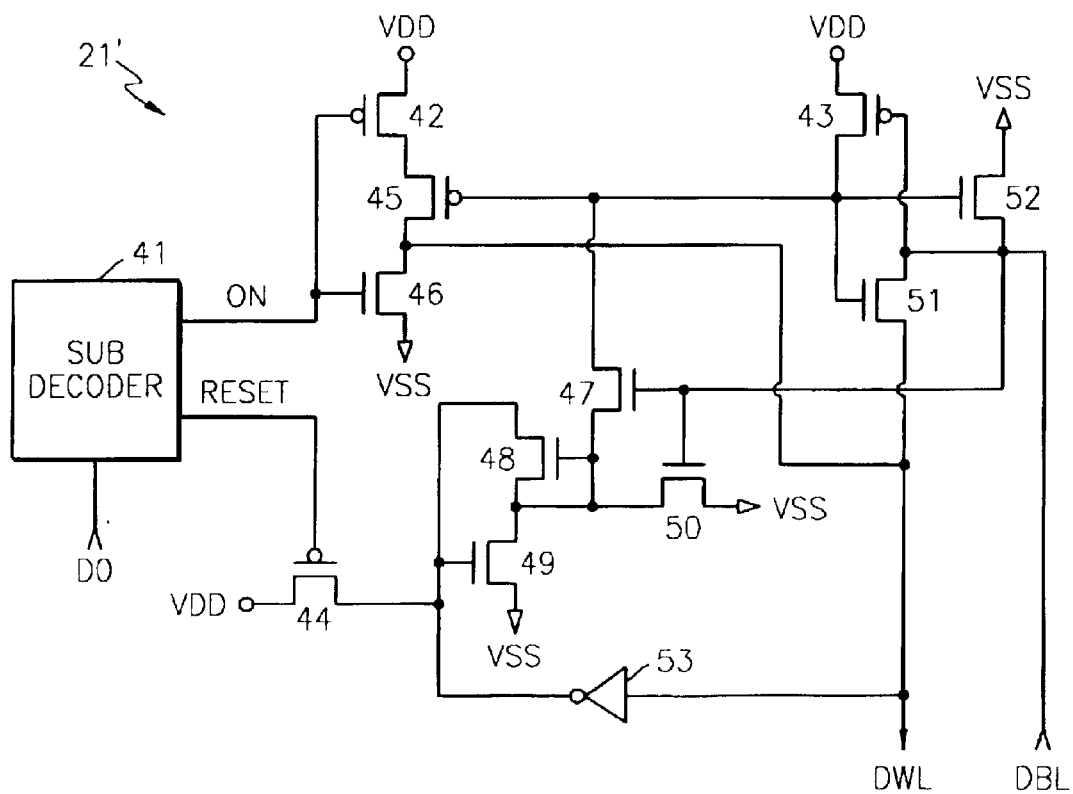
FIG. 4 is a detailed circuit diagram of a process tracking circuit according to further embodiments of the present invention.

FIG. 4 is a detailed circuit diagram of the process tracking circuit 21' according to some embodiments of present invention. The process tracking circuit 21' includes a subdecoder 41, first through fourth PMOS transistors 42, 43, 44 and 45, first through seventh NMOS transistors 46, 47, 48, 49, 50, 51 and 52, and an inverter 53.

The first PMOS transistor 42 has a source to which a power supply voltage is applied and a gate to which an ON signal is applied. The second PMOS transistor 45 has a source that is connected a drain of the first PMOS transistor 42 and a drain that is connected to the dummy word line DWL. The first NMOS transistor 46 has a drain which is connected to the dummy word line DWL, a gate to which an on signal ON is applied, and a source to which a ground voltage VSS is applied. The second NMOS transistor 47 has a drain that is connected to a gate of the second PMOS transistor 45 and a gate that is connected to the dummy bit line DBL. The inverter 53 inverts a signal of the dummy word line DWL.

The third PMOS transistor 44 has source to which a power supply voltage VDD is applied, a gate to which a reset signal RESET is applied, and a drain to which a signal output from the inverter 53 is applied. The third NMOS transistor 48 has a drain to which a signal output from the inverter 53 and a gate and a source which are connected to a source of the second NMOS transistor 47. The fourth NMOS transistor 49 has a drain which is connected to the source of the third NMOS transistor 48, a gate to which a signal output from the inverter 53 is applied, and a source to which the ground voltage VSS is applied. The fifth NMOS transistor 50 has a drain which is connected to the source of the third NMOS transistor 48, a gate which is connected to the dummy bit line DBL, and a source to which the ground voltage VSS is applied.

The fourth PMOS transistor 43 has a source to which the power supply voltage VDD is applied, a gate which is connected to the dummy bit line DBL, and a drain which is connected to the gate of the second PMOS transistor 45. The sixth NMOS transistor 51 has a drain that is connected to the dummy bit line DBL, a gate that is connected to the drain of the fourth transistor 43, and a source that is connected to the dummy word line DWL. The seventh NMOS transistor 52 has a drain that is connected to the dummy bit line DBL, a gate that is connected to the drain of the fourth PMOS transistor 43, and a source to which the ground voltage VDD is applied. The subdecoder 41 generates the on signal ON and the reset signal RESET in response to the signal DO output from the address decoder 29 shown in FIG. 2.

When the output signal DO of the address decoder 29 that corresponds to the word line WL is input, the on signal ON becomes logic "low" by action of the subdecoder 41 and, thus, the first PMOS transistor 42 is turned on. Because the second PMOS transistor 45 is turned of, the dummy word line DWL becomes logic "high" and the pass transistors 33 and 34 in the dummy cell shown in FIG. 3 are turned on. Thus, the dummy bit line DBL begins to discharge through the pass transistor 33 and the inverter 31.

When the dummy bit line DBL is discharged to a predetermined level VDD–Vtp, the fourth PMOS transistor 43 turns on, causing the sixth NMOS transistor 51 to turn on. This causes the dummy word line DWL to be discharged to the level of the dummy bit line DBL. Thus, the pass transistors 33 and 34 in the dummy cell start to turn off and a discharge rate of the dummy bit line DBL is reduced.

When the characteristics of PMOS transistors change so that the operating speed of the PMOS transistors becomes faster, and the characteristics of NMOS transistors change so that the operating speed of the NMOS transistors becomes slower, the difference between delay times in the path for generating the sense amplifier enable signal SAEN and the path for sensing data can increase significantly. If the characteristics of a PMOS transistor in the path for generating the sense amplifier enable signal SAEN are changed so that an operating speed becomes faster, the process tracking circuit 21' can slow down the discharge rate of the dummy bit line DBL so as to delay generation of the sense amplifier enable signal SAEN.

The third PMOS transistor 44 is turned on with the activation of the reset signal RESET, which causes the fourth NMOS transistor 49 to turn on. As a result, the dummy word line DWL is reset. The dummy bit line DBL is pre-charged with the normal bit line BL. The third NMOS transistor 48 prevents the sixth NMOS transistor 51 from being turned on when the dummy word line DWL rises to logic "high". The second and fifth NMOS transistors 47 and 50 and the inverter 53 maintain a gate voltage of the second PMOS transistor 45 at less than a threshold voltage Vtn while the dummy bit line DBL is being discharged in order to prevent the sixth NMOS transistor 51 from being turned on by noise before the dummy bit line DBL is fully discharged.

Figure 5:
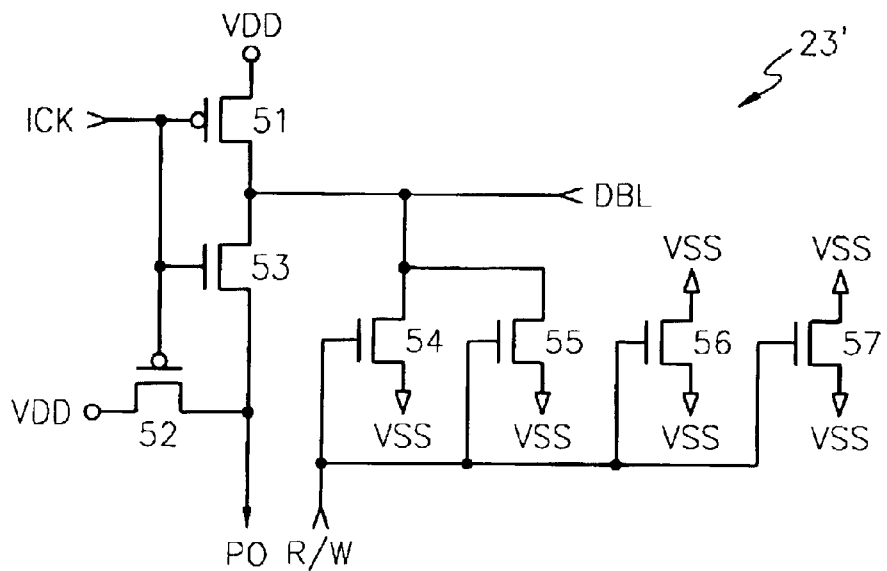
FIG. 5 is a detailed circuit diagram of a process adjusting circuit according to still further embodiments of the present invention.

FIG. 5 is a detailed circuit diagram of a process adjusting circuit 23' according to further embodiments of the present invention. The process adjusting circuit 23' includes first and second PMOS transistors 51 and 52, and first through fifth NMOS transistors 53, 54, 55, 56 and 57. The first PMOS transistor 51 has a source to which a power supply voltage VDD is applied, a gate to which an internal clock signal ICK is applied, and a drain that is connected to the dummy bit line DBL. The first NMOS transistor 53 has a drain that is connected the dummy bit line DBL, a gate to which the internal clock signal ICK is applied, and a source from which an output signal PO is output. The second PMOS transistor 52 has a source to which the power supply voltage VDD is applied, a gate to which the internal clock signal ICK is applied, and a drain which is connected to the source of the first NMOS transistor 53.

The second NMOS transistor 54 has a drain which is connected to the dummy bit line DBL, a gate to which a read/write control signal R/W is applied, and a source to which a ground voltage VSS is applied. The third NMOS transistor 55 has a drain which is connected to the dummy bit line DBL, a gate to which read/write control signal R/W is applied, and a source to which the ground voltage VSS is applied. The fourth NMOS transistor 56 has a drain and a source to which the ground voltage VSS is applied and a gate to which the read/write control signal R/W is applied. The fifth NMOS transistor 57 has a drain and a source to which the ground voltage VSS is applied and a gate to which the read/write control signal R/W is applied.

When the internal clock signal ICK signal is "high," the first NMOS transistor 53 does not operate until the dummy bit line DBL reaches a predetermined level VDD–Vtn. After the dummy bit line DBL is fully discharged, the first NMOS transistor 53 starts operating, causing the output signal P0 to sharply fall due to charge transfer. Variations in delay times of PMOS transistors that are connected to the output signal P0 due to the process variation can be compensated for by generating the output signal P0 from the dummy bit line DBL through the first NMOS transistor 53.

The second through fifth NMOS transistors 54, 55, 56 and 57 are turned on in a write operation to increase the discharge rate of the dummy bit line DBL in comparison to the discharge rate in a read operation. Thus, a pulse width of a signal of the word line WL may be reduced in the write operation in comparison to the read operation. As a result, operating speed can be increased and power consumption can be reduced.

As described above, a replica-type sense amplifier enable signal generating circuit according to some embodiments of the present invention can minimize the difference between the delay characteristic of the path for sensing data and the delay characteristic of the path for generating the sense amplifier enable signal in the presence of process variation. Thus, in a semiconductor memory device having a sense amplifier enable signal generating circuit according to embodiments of the present invention, an unstable sensing operation or a slow sensing speed due to process variation can be ameliorated or prevented. In addition, the pulse width of the signal of the word line WL may not need to be increased, and power consumption can be reduced.

Figure 6:
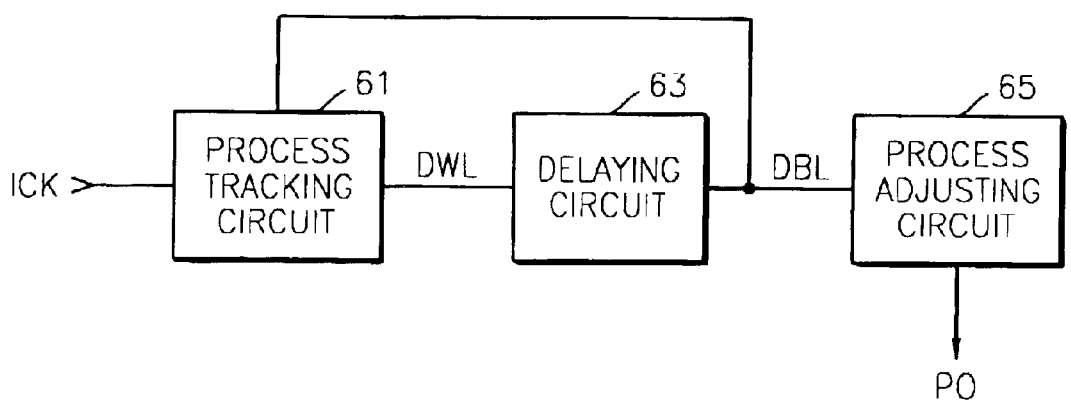
FIG. 6 is a block diagram of an inverter delay chain type sense amplifier enable signal generating circuit according to some embodiments of the present invention.

FIG. 6 is a block diagram of an inverter delay chain type sense amplifier enable signal generating circuit according to further embodiments of the present invention. Referring to FIG. 6, the inverter delay chain type sense amplifier enable signal generating circuit includes a delaying circuit 63, a process tracking circuit 61, and a process adjusting circuit 65. The delaying circuit 63 includes a plurality of series inverters and delays an input signal DWL. The process tracking circuit 61 adjusts a level of the input signal DWL in response to an internal clock signal ICK and a level of a signal DBL output from the delaying circuit 63 in order to adjust a discharge rate of the signal DBL output form the delaying circuit 63. The process adjusting circuit 65 generates an output signal P0 as a sense amplifier enable signal by providing that output signal P0 by effectively adjusting the slope of the signal output from the delaying circuit 63.

The process tracking circuit 61 and the process adjusting circuit 65 are substantially the same as the process tracking circuit 21 and the process adjusting circuit 23 of the replica-type sense amplifier enable signal generating circuit 300 described above with reference to FIG. 2. However, instead of a control signal D0, the internal clock signal ICK is input to the process tracking circuit 61. The inverter delay chain type sense amplifier enable signal generating circuit shown in FIG. 6 may be used in the semiconductor memory device shown in FIG. 2, instead of the replica-type sense amplifier enable signal generating circuit 300, in order to achieve substantially similar performance. The operation of the inverter delay chain type sense amplifier enable signal generating circuit is substantially similar to the operation of the replica-type sense amplifier enable signal generating circuit 300, and thus further detailed description thereof will be omitted.

As described above, sense amplifier enable signal generating circuits according to embodiments of the present invention can limit the difference between a delay characteristic of a path for sensing data and a delay characteristic of a path for generating a sense amplifier enable signal in the presence of process variations. Thus, in the semiconductor memory device having a sense amplifier enable signal generating circuit according to some embodiments of the present invention, an unstable sensing operation or a slow sensing speed due to the process variation can be prevented. In addition, the pulse width of the signal of the word line not need to be increased and, thus, power consumption can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A sense amplifier enable signal generating circuit for generating a sense amplifier enable signal that enables a bit line sense amplifier, the sense amplifier enable signal generating circuit comprising:
    a dummy bit cell that is connected to a dummy word line and a dummy bit line and discharges the dummy bit line in response to a signal level of the dummy word line;
    a process tracking circuit which adjusts a signal level of the dummy word line in response to a signal level of the dummy bit line to adjust a discharge rate of the dummy bit line; and
    a sense amplifier control circuit that generates the sense amplifier enable signal responsive to the signal level of the dummy bit line.

2. The sense amplifier enable signal generating circuit of claim 1, wherein the sense amplifier control circuit comprises:
    a control circuit that generates the sense amplifier enable signal responsive to an internal clock signal and a control signal; and
    a process adjusting circuit that is connected to the dummy bit line and that generates the control signal responsive to a signal level on the dummy bit line and the internal clock signal.

3. The sense amplifier enable signal generating circuit of claim 2, wherein the process adjusting circuit is operative, when the signal level of the dummy bit line passes through a predetermined voltage, to transition the control signal at a greater rate than a transition rate of the signal level of the dummy bit line.

4. The sense amplifier enable signal generating circuit of claim 2, wherein the internal clock signal is generated from an externally-applied clock signal.

5. The sense amplifier enable signal generating circuit of claim 2, wherein the process adjusting circuit comprises:
    a first PMOS transistor having a source to which a power supply voltage is applied, a gate to which the internal clock signal is applied, and a drain which is connected to the dummy bit line;
    a first NMOS transistor having a drain which is connected to the dummy bit line, a gate to which the internal clock signal is applied, and a source from which the control signal is produced; and
    a second PMOS transistor having a source to which the power supply voltage is applied, a gate to which the internal clock signal is applied, and a drain that is connected to the source of the first NMOS transistor.

6. The sense amplifier enable signal generating circuit of claim 5, wherein the process adjusting circuit further comprises:
    a second NMOS transistor having a drain that is connected to the dummy bit line, a gate to which a read/write control signal is applied, and a source to which a ground voltage is applied;
    a third NMOS transistor having a drain to which is connected to the dummy bit line, a gate to which the read/write control signal is applied, and a source to which the ground voltage is applied;
    a fourth NMOS transistor having a drain and a source to which the ground voltage is applied and a gate to which the read/write control signal is applied; and
    a fifth NMOS transistor having a drain and a source to which the ground voltage is applied and a gate to which the read/write control signal is applied.

7. The sense amplifier enable signal generating circuit of claim 1, wherein the dummy bit cell comprises:
    a first inverter, an input node of which is connected to a power supply voltage;
    a second inverter, an input node of which is connected to an output node of the first inverter;
    a first pass transistor which is connected between the output node of the first inverter and the dummy bit line, and a gate of which is connected to the dummy word line; and
    a second pass transistor that is connected between the output node of the second inverter and a line that is complementary to the dummy bit line, and a gate of which is connected to the dummy word line.

8. The sense amplifier enable signal generating circuit of claim 1, wherein the process tracking circuit comprises:
    a first PMOS transistor having a source to which a power supply voltage is applied and a gate to which an on signal is applied;
    a second PMOS transistor having a source that is connected to a drain of the first PMOS transistor and a drain that is connected to the dummy word line;
    a first NMOS transistor having a drain that is connected to the dummy word line, a gate to which the on signal is applied, and a source to which a ground voltage is applied;
    a second NMOS transistor having a drain that is connected to a gate of the second PMOS transistor and a gate that is connected to the dummy bit line;
    an inverter that inverts a signal of the dummy word line;
    a third PMOS transistor having a source to which the power supply voltage is applied, a gate to which a reset signal is applied, and a drain to which a signal output from the inverter is applied;
    a third NMOS transistor having a drain to which the signal output from the inverter is applied and a gate and a source which are connected to a source of the second NMOS transistor;
    a fourth NMOS transistor having a drain which is connected to the source of the third NMOS transistor, a gate to which the signal output from the inverter is applied, and a source to which the ground voltage is applied;

a fifth NMOS transistor having a drain which is connected to the source of the third NMOS transistor, a gate which is connected to the dummy bit line, and a source to which the ground voltage is applied;

a fourth PMOS transistor having a source to which the power supply voltage is applied, a gate which is connected to the dummy bit line, and a drain which is connected to the gate of the second PMOS transistor;

a sixth NMOS transistor having a drain which is connected to the dummy bit line, a gate which is connected to the drain of the fourth PMOS transistor, and a source which is connected to the dummy word line; and a seventh NMOS transistor having a drain that is connected to the dummy bit line, gate which is connected to the drain of the fourth PMOS transistor, and a source to which the ground voltage is applied.

9. The sense amplifier enable signal generating circuit of claim 8, wherein the process tracking circuit further comprises a subdecoder which generates the on signal and the reset signal in response to a signal output from an address decoder.

10. A semiconductor memory device comprising:

a bit cell which is connected to a word line and a pair of bit lines and which data is input to and output from through the pair of bit lines in response to a signal on the word line;

a bit line sense amplifier that senses and amplifies data of the pair of bit lines in response to an enable signal;

a dummy bit cell that is connected to a dummy word line and a dummy bit line and discharges the dummy bit line in response to a signal on the dummy word line;

a process tracking circuit which adjusts a signal level of the dummy word line in response to a signal level of the dummy bit line and a decoder output signal to adjust a discharge rate the dummy bit line;

a control circuit that generates a sense amplifier enable signal responsive to an internal clock signal and a control signal;

a process adjusting circuit that is connected to the dummy bit line and that generates the control signal responsive to a signal level on the dummy bit line and the internal clock signal; and an address decoder that decodes an address applied from an external source to activate the word line and the decoder output signal.

11. The semiconductor memory device of claim 10, wherein the internal clock signal is generated from an external clock signal that is applied to the semiconductor memory device.

12. The semiconductor memory device of claim 10, wherein the dummy bit cell comprises:

a first inverter, an input node of which is connected to a power supply voltage;

a second inverter, an input node of which is connected to an output node of the first inverter;

a first pass transistor which is connected between the output node of the first inverter and the dummy bit line, and a gate of which is connected to the dummy word line; and a second pass transistor that is connected between the output node of the first inverter and a line that is complementary to the dummy bit line, and a gate of which is connected to the dummy word line.

13. The semiconductor memory device of claim 10, wherein the process tracking circuit comprises:

a first PMOS transistor having a source to which a power supply voltage is applied and a gate to which an on signal is applied;

a second PMOS transistor having a source that is connected to a drain of the first PMOS transistor and a drain that is connected to the dummy word line;

a first NMOS transistor having a drain that is connected to the dummy word line, a gate to which the on signal is applied, and a source to which a ground voltage is applied;

a second NMOS transistor having a drain that is connected to a gate of the second PMOS transistor and a gate that is connected to the dummy bit line;

an inverter that inverts a signal of the dummy word line;

a third PMOS transistor having a source to which the power supply voltage is applied, a gate to which a reset signal is applied, and a drain to which a signal output from the inverter is applied;

a third NMOS transistor having a drain to which the signal output from the inverter is applied and a gate and a source which are connected to a source of the second NMOS transistor;

a fourth NMOS transistor having a drain which is connected to the source of the third NMOS transistor, a gate to which the signal output from the inverter is applied, and a source to which the ground voltage is applied;

a fifth NMOS transistor having a drain which is connected to the source of the third NMOS transistor, a gate which is connected to the dummy bit line, and a source to which the ground voltage is applied;

a fourth PMOS transistor having a source to which the power supply voltage is applied, a gate which is connected to the dummy bit line, and a drain which is connected to the gate of the second PMOS transistor;

a sixth NMOS transistor having a drain which is connected to the dummy bit line, a gate which is connected to the drain of the fourth PMOS transistor, and a source which is connected to the dummy word line; and a seventh NMOS transistor having a drain that is connected to the dummy bit line, gate which is connected to the drain of the fourth PMOS transistor, and a source to which the ground voltage is applied.

14. The semiconductor memory device of claim 13, wherein the process tracking circuit further comprises a subdecoder which generates the on signal and the reset signal in response to the decoder output signal.

15. The semiconductor memory device of claim 10, wherein the process adjusting circuit comprises:

a first PMOS transistor having a source to which a power supply voltage is applied, a gate to which the internal clock signal is applied, and a drain which is connected to the dummy bit line;

a first NMOS transistor having a drain which is connected to the dummy bit line, a gate to which the internal clock signal is applied, and a source from which a signal output from the process adjusting signal is output; and a second PMOS transistor having a source to which the power supply voltage is applied, a gate to which the internal clock signal is applied, and a drain that is connected to the source of the first NMOS transistor.

16. The semiconductor memory device of claim 15, wherein the process adjusting circuit further comprises:

a second NMOS transistor having a drain that is connected to the dummy bit line, a gate to which a read/write control signal is applied, and a source to which a ground voltage is applied;
a third NMOS transistor having a drain to which is connected to the dummy bit line, a gate to which the read/write control signal is applied, and a source to which the ground voltage is applied;
a fourth NMOS transistor having a drain and a source to which the ground voltage is applied and a gate to which the read/write control signal is applied; and
a fifth NMOS transistor having a drain and a source to which the ground voltage is applied and a gate to which the read/write control signal is applied.

17. A sense amplifier enable signal generating circuit of a semiconductor memory device for generating a signal which enables a bit line sense amplifier, the sense amplifier enable signal generating circuit comprising:
a delay circuit that is connected to a dummy word line and that produces a delayed output signal on a dummy bit line responsive to an input signal on the dummy word line;
a process tracking circuit which adjusts a level of the input signal in response an internal clock signal and a signal level of the output signal produced by the delay circuit to adjust a discharge rate of the output signal produced by the delay circuit; and
a sense amplifier control circuit that produces a sense amplifier enable signal responsive to the signal level of the output signal produced by the delay circuit.

18. The sense amplifier enable signal generating circuit of claim 17, wherein the sense amplifier control circuit comprises:
a control circuit that generates the sense amplifier enable signal responsive to the internal clock signal and a control signal; and
a process adjusting circuit that is connected to the dummy bit line and that generates the control signal responsive to a level of the output signal on the dummy bit line and the internal clock signal.

19. The sense amplifier enable signal generating circuit of claim 17, wherein the internal clock signal is generated from an external clock signal that is applied to the semiconductor memory device.

20. The sense amplifier enable signal generating circuit of claim 17, wherein the process tracking circuit comprises:
a first PMOS transistor having a source to which a power supply voltage is applied and a gate to which an on signal is applied;
a second PMOS transistor having a source that is connected to a drain of the first PMOS transistor and a drain that is connected to an input node of the delaying circuit;
a first NMOS transistor having a drain that is connected to the input node of the delaying circuit, a gate to which the on signal is applied, and a source to which a ground voltage is applied;
a second NMOS transistor having a drain that is connected to a gate of the second PMOS transistor and a gate that is connected to an output node of the delaying circuit;
an inverter that inverts a signal of the delaying circuit;
a third PMOS transistor having a source to which the power supply voltage is applied, a gate to which a reset signal is applied, and a drain to which a signal output from the inverter is applied;
a third NMOS transistor having a drain to which the signal output from the inverter is applied and a gate and a source which are connected to a source of the second NMOS transistor;
a fourth NMOS transistor having a drain which is connected to the source of the third NMOS transistor, a gate to which the signal output from the inverter is applied, and a source to which the ground voltage is applied;
a fifth NMOS transistor having a drain which is connected to the source of the third NMOS transistor, a gate which is connected to the output node of the delaying circuit, and a source to which the ground voltage is applied;
a fourth PMOS transistor having a source to which the power supply voltage is applied, a gate which is connected to the output node of the delaying circuit, and a drain which is connected to the gate of the second PMOS transistor;
a sixth NMOS transistor having a drain which is connected to the output node of the delaying circuit, a gate which is connected to the drain of the fourth PMOS transistor, and a source which is connected to the input node of the delaying circuit; and
a seventh NMOS transistor having a drain which is connected to the output node of the delaying circuit, gate which is connected to the drain of the fourth PMOS transistor, and a source to which the ground voltage is applied.

21. The sense amplifier enable signal generating circuit of claim 20, wherein the process tracking circuit further comprises a subdecoder which generates the on signal and the reset signal in response to the internal clock signal.

22. The sense amplifier enable signal generating circuit of claim 18, wherein the process adjusting circuit comprises:
a first PMOS transistor having a source to which the power supply voltage is applied, gate to which the internal clock signal is applied, and a drain which is connected to the dummy bit line;
a first NMOS transistor having a drain which is connected to the dummy bit line, a gate to which the internal clock signal is applied, and a source from which a signal output from the process adjusting signal is output; and
a second PMOS transistor having a source to which the power supply voltage is applied, a gate to which the internal clock signal is applied, and a drain that is connected to the source of the first NMOS transistor.

23. The sense amplifier enable signal generating circuit of claim 22, wherein the process adjusting circuit further comprises:
a second NMOS transistor having a drain that is connected to the dummy bit line, a gate to which a read/write control signal is applied, and a source to which the ground voltage is applied;
a third NMOS transistor having a drain to which is connected to the dummy bit line, a gate to which the read/write control signal is applied, and a source to which the ground voltage is applied;
a fourth NMOS transistor having a drain and a source to which the ground voltage is applied and a gate to which the read/write control signal is applied; and
a fifth NMOS transistor having a drain and a source to which the ground voltage is applied and a gate to which the read/write control signal is applied.

24. A semiconductor memory device comprising:
a bit cell which is connected to a word line and a pair of bit lines and which data is input to and output from through the pair of bit lines in response to a signal of the word line;

a bit line sense amplifier that senses and amplifies data of the pair of bit lines in response to an enable signal;

a delay circuit that produces a delayed output signal on a dummy bit line responsive to an input signal applied thereto on a dummy word line;

a process tracking circuit which adjusts a level of the input signal in response an internal clock signal and a level of the output signal produced by the delay circuit to adjust a discharge rate of the output signal produced by the delay circuit;

a control circuit that generates a sense amplifier enable signal responsive to an internal clock signal and a control signal; and a process adjusting circuit that is connected to the dummy bit line and that generates the control signal responsive to the output signal on the dummy bit line.

25. The semiconductor memory device of claim 24, wherein the internal clock signal is generated from an external clock signal that is applied to the semiconductor memory device.

26. The semiconductor memory device of claim 24, wherein the process tracking circuit comprises:

a first PMOS transistor having a source to which a power supply voltage is applied and a gate to which an on signal is applied;

a second PMOS transistor having a source that is connected to a drain of the first PMOS transistor and a drain that is connected to an input node of the delaying circuit;

a first NMOS transistor having a drain that is connected to the input node of the delaying circuit, a gate to which the on signal is applied, and a source to which a ground voltage is applied;

a second NMOS transistor having a drain that is connected to a gate of the second PMOS transistor and a gate that is connected to an output node of the delaying circuit;

an inverter that inverts a signal of the delaying circuit;

a third PMOS transistor having a source to which the power supply voltage is applied, a gate to which a reset signal is applied, and a drain to which a signal output from the inverter is applied;

a third NMOS transistor having a drain to which the signal output from the inverter is applied and a gate and a source which are connected to a source of the second NMOS transistor;

a fourth NMOS transistor having a drain which is connected to the source of the third NMOS transistor, a gate to which the signal output from the inverter is applied, and a source to which the ground voltage is applied;

a fifth NMOS transistor having a drain which is connected to the source of the third NMOS transistor, a gate which is connected to the output node of the delaying circuit, and a source to which the ground voltage is applied;

a fourth PMOS transistor having a source to which the power supply voltage is applied, a gate which is connected to the output node of the delaying circuit, and a drain which is connected to the gate of the second PMOS transistor;

a sixth NMOS transistor having a drain which is connected to the output node of the delaying circuit, a gate which is connected to the drain of the fourth PMOS transistor, and a source which is connected to the input node of the delaying circuit; and a seventh NMOS transistor having a drain which is connected to the output node of the delaying circuit, gate which is connected to the drain of the fourth PMOS transistor, and a source to which the ground voltage is applied.

27. The semiconductor memory device of claim 26, wherein the process tracking circuit further comprises a subdecoder which generates the on signal and the reset signal in response to the internal clock signal.

28. The semiconductor memory device of claim 24, wherein the process adjusting circuit comprises:

a first PMOS transistor having a source to which a power supply voltage is applied, a gate to which the internal clock signal is applied, and a drain which is connected to the dummy bit line;

a first NMOS transistor having a drain which is connected to the dummy bit line, a gate to which the internal clock signal is applied, and a source from which a signal output from the process adjusting signal is output; and a second PMOS transistor having a source to which the power supply voltage is applied, a gate to which the internal clock signal is applied, and a drain that is connected to the source of the first NMOS transistor.

29. The semiconductor memory device of claim 28, wherein the process adjusting circuit further comprises:

a second NMOS transistor having a drain that is connected to the dummy bit line, a gate to which a read/write control signal is applied, and a source to which the ground voltage is applied;

a third NMOS transistor having a drain to which is connected to the dummy bit line, a gate to which the read/write control signal is applied, and a source to which the ground voltage is applied;

a fourth NMOS transistor having a drain and a source to which the ground voltage is applied and a gate to which the read/write control signal is applied; and a fifth NMOS transistor having a drain and a source to which the ground voltage is applied and a gate to which the read/write control signal is applied.

* * * * *